United States Patent
Kotlanka et al.

(10) Patent No.: US 8,940,616 B2
(45) Date of Patent: Jan. 27, 2015

(54) BONDING METHOD USING POROSIFIED SURFACES FOR MAKING STACKED STRUCTURES

(75) Inventors: Rama Krishna Kotlanka, Singapore (SG); Rakesh Kumar, Singapore (SG); Premachandran Chirayarikathuveedu Sankarapillai, Clifton Park, NY (US); Huamao Lin, Singapore (SG); Pradeep Yelehanka, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/559,626

(22) Filed: Jul. 27, 2012

(65) Prior Publication Data

US 2014/0030847 A1 Jan. 30, 2014

(51) Int. Cl.
H01L 21/30 (2006.01)
H01L 21/46 (2006.01)
H01L 21/76 (2006.01)
H01L 21/00 (2006.01)

(52) U.S. Cl.
USPC ............ 438/455; 438/960; 438/409; 438/67; 438/667

(58) Field of Classification Search
USPC ............ 438/455–459, 406, 409, 960, 15, 26, 438/50–53, 67, 106, 107; 156/228; 422/502
See application file for complete search history.

(56) References Cited

U.S. PATENT DOCUMENTS

| | | | |
|---|---|---|---|
| 5,536,361 A * | 7/1996 | Kondo et al. | 438/492 |
| 5,829,125 A * | 11/1998 | Fujimoto et al. | 29/840 |
| 6,229,190 B1 * | 5/2001 | Bryzek et al. | 257/419 |
| 6,323,550 B1 * | 11/2001 | Martin et al. | 257/704 |
| 6,806,557 B2 * | 10/2004 | Ding | 257/659 |
| 6,929,974 B2 * | 8/2005 | Ding et al. | 438/106 |
| 7,029,986 B2 * | 4/2006 | Canham et al. | 438/406 |
| 7,307,775 B2 * | 12/2007 | Patel et al. | 359/291 |
| 7,442,570 B2 | 10/2008 | Nasiri et al. | |
| 7,795,723 B2 * | 9/2010 | Chau et al. | 257/704 |
| 7,829,913 B2 * | 11/2010 | Shibata et al. | 257/103 |
| 7,892,954 B2 * | 2/2011 | Balucani | 438/487 |
| 2001/0041423 A1 * | 11/2001 | Nishida et al. | 438/455 |
| 2005/0074919 A1 * | 4/2005 | Patel et al. | 438/107 |
| 2006/0113635 A1 * | 6/2006 | Notsu et al. | 257/616 |
| 2008/0003778 A1 * | 1/2008 | Eyck et al. | 438/455 |
| 2010/0224994 A1 | 9/2010 | Yun | |
| 2011/0079889 A1 * | 4/2011 | Baillin | 257/682 |
| 2012/0229709 A1 * | 9/2012 | Heald et al. | 348/739 |
| 2012/0313235 A1 * | 12/2012 | Chu et al. | 257/692 |

OTHER PUBLICATIONS

Wang et al., Size control of Cu nanorods through oxygen-mediated growth and low temperature sintering, Nanotechnology, Feb. 2, 2009, 8pp, vol. 20, IOP Publishing, UK.

* cited by examiner

*Primary Examiner* — Mary Wilczewski
*Assistant Examiner* — Erik T Peterson
(74) *Attorney, Agent, or Firm* — Horizon IP Pte. Ltd.

(57) ABSTRACT

A bonded device having at least one porosified surface is disclosed. The porosification process introduces nanoporous holes into the microstructure of the bonding surfaces of the devices. The material property of a porosified material is softer as compared to a non-porosified material. For the same bonding conditions, the use of the porosified bonding surfaces enhances the bond strength of the bonded interface as compared to the non-porosified material.

26 Claims, 17 Drawing Sheets

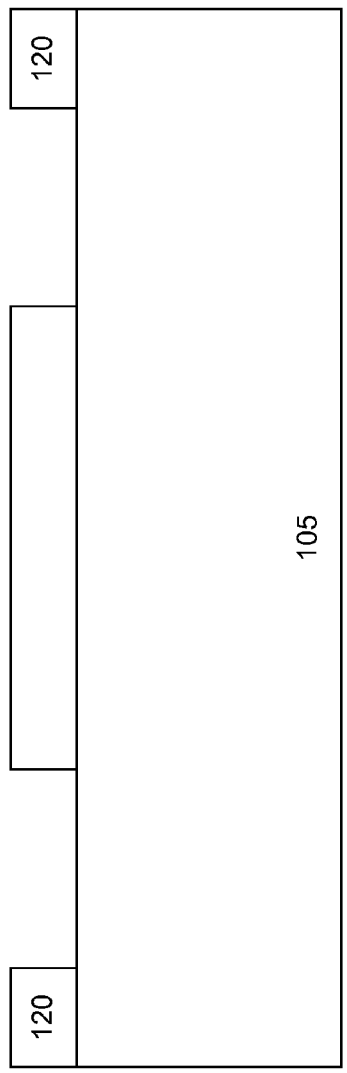
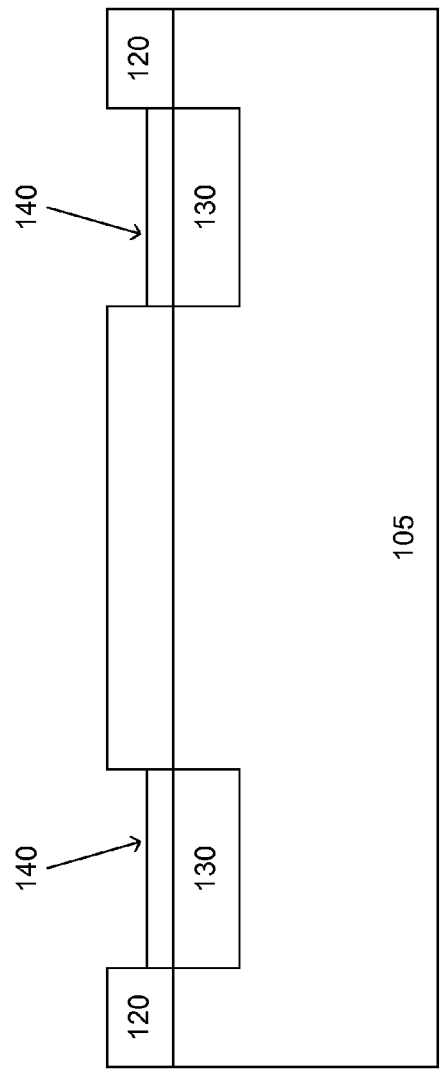

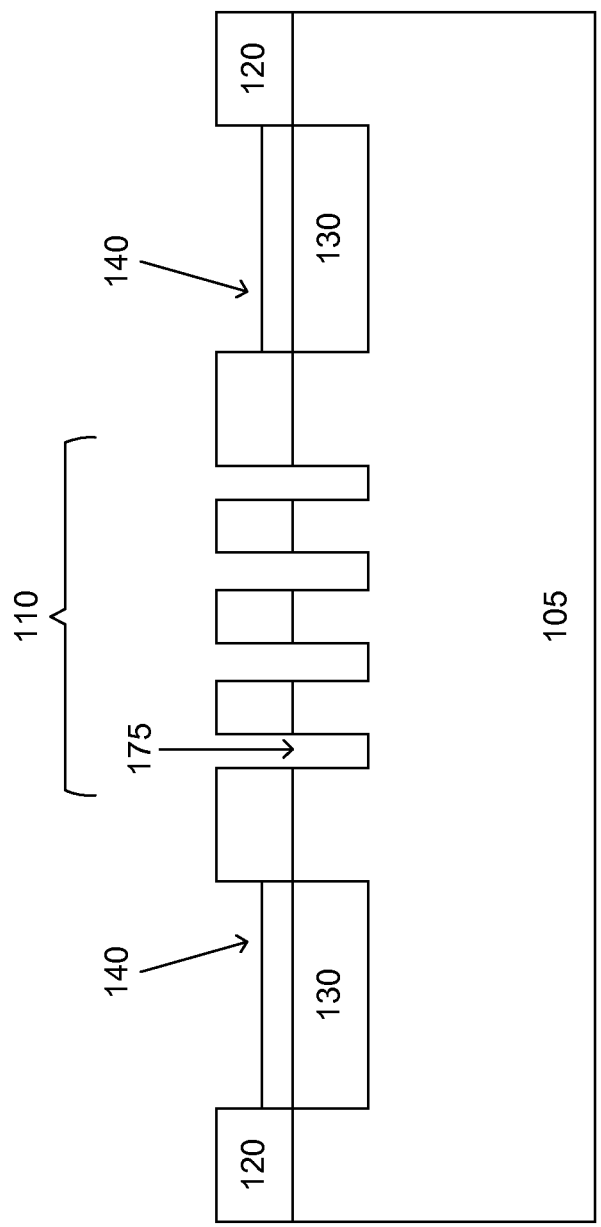

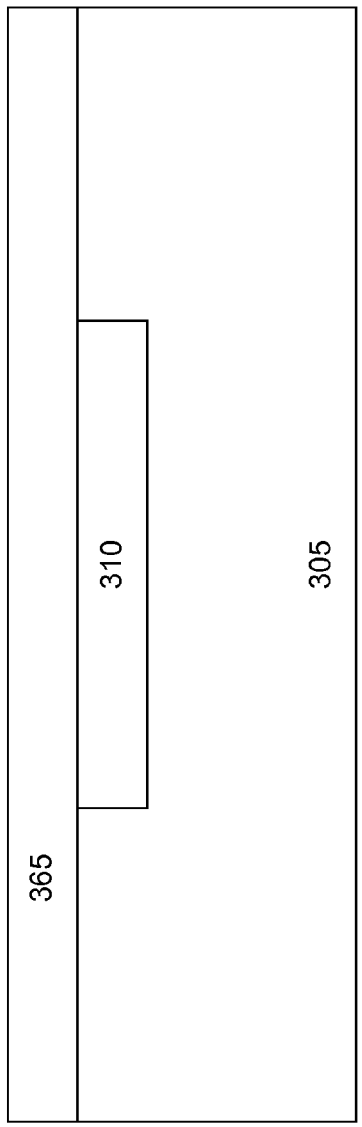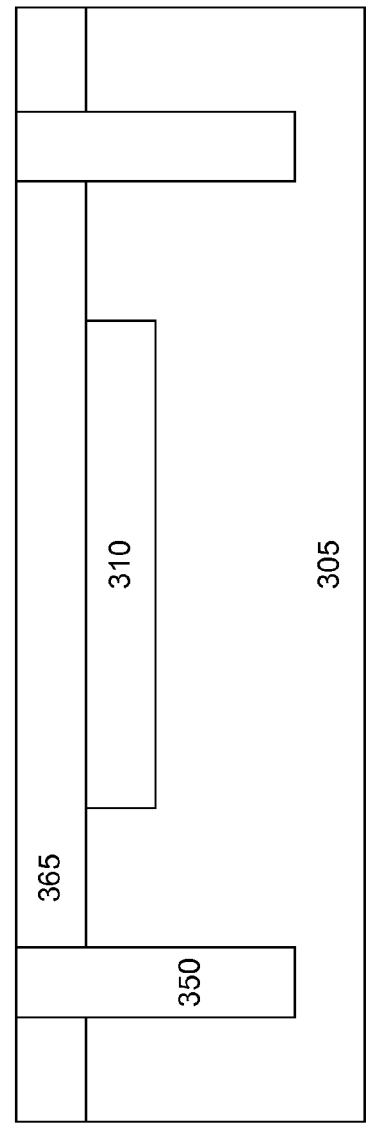

BONDING METHOD USING POROSIFIED SURFACES FOR MAKING STACKED STRUCTURES

BACKGROUND

Recent innovations in three-dimensional (3D) chip, die and wafer integration (hereinafter, collectively, stacked structures) have enabled a greater miniaturization of devices as well as technological advancements in increased speed and density, with reduced power consumption and cost. However, further cost-effective miniaturization is presently hindered by bonding related issues affecting the manufacturability and mass production of 3D integrated circuits (IC) stacked structures. Current bonding processes, e.g., copper-to-copper (Cu—Cu) bonding, oxide bonding, soldering bonding, or other polymer bonding processes, fail to adequately address the industry's increasing requirements for precision alignment, bonding strength, electrical interconnection, and manufacturability. For instance, wafer bonding involving complementary metal-oxide-semiconductor (CMOS) wafers would require the bonding temperature to be limited to about 400° C. Additionally, a high force needs to be applied to the wafers in order to achieve a reasonable bonding strength. However, the application of high bonding force for wafer-to-wafer level bonding may result in increased wafer breakages.

A need, therefore, exists for a bonding methodology enabling the fabrication of 3D IC stacked structures with improved alignment, bonding strength, electrical interconnection, and manufacturability at lower bonding forces and lower temperatures.

SUMMARY

A method for bonding semiconductor surfaces to create stacked structures by having a first semiconductor surface with a first device and first bonding region and a second semiconductor surface with a second bonding region. A porosified surface is formed on either the first or second bonding region. The first and second bonding regions are aligned and bonded by application of pressure and heat.

In another embodiment, the porosified surface is formed on either the first or second bonding region with a metal layer over the said porosified surface. The first and second bonding regions are aligned and bonded by application of pressure and heat.

In yet another embodiment, a porosified surface is formed on either the first or second bonding region. A layer of sintered metal or metal nanowires is formed on the surface of the other bonding region. The first and second bonding regions are aligned and bonded by application of pressure and heat.

In the fourth embodiment, the porosified surface is formed on either the first or second bonding region with a metal layer over the said porosified surface. A layer of sintered metal or metal nanowires is formed on the surface of the other bonding region. The first and second bonding regions are aligned and bonded by application of pressure and heat.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 9a-e show a process flow for forming a first device in accordance with one embodiment of the invention;

FIGS. 11a-c show a process flow for forming a second device in accordance with one embodiment of the invention

DETAILED DESCRIPTION

In the following descriptions, the embodiments relate to wafer bonding (wafer-wafer) between Micro-Electro-Mechanical System (MEMS) devices and semiconductor IC devices. In general, the embodiments are further applicable to wafer-to-chip and chip-to-chip bonding, including MEMS, semiconductor IC or other hybrid devices. The MEMS devices may be of various types such as Radio Frequency (RF) MEMS, Inertial MEMS or BioMEMS. Other types of MEMS devices may also be used. The semiconductor IC devices may be of various types such as Bipolar or Complementary Metal Oxide Semiconductor (CMOS). Other types of semiconductor devices may also be used. The embodiments relate to preparations of to-be-bonded surfaces to achieve a high bonding strength for an application of low bond force. The embodiments may be employed in, for example, wafer level bonding, wafer level packaging or wafer level capping. Other types of applications may also be useful.

Other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
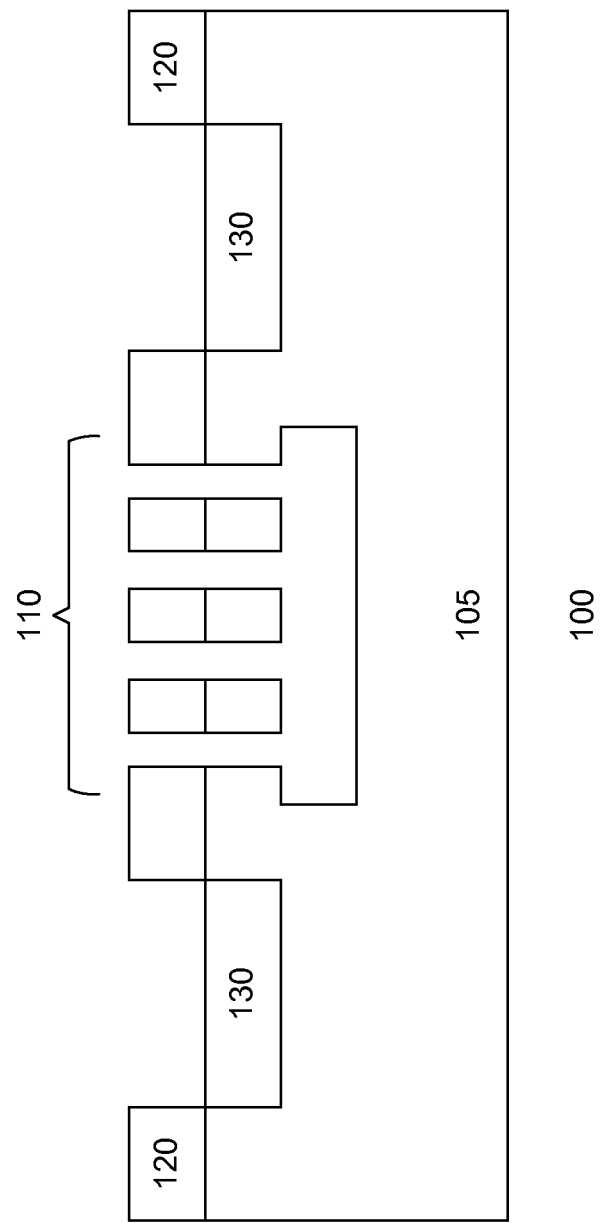
FIG. 1 shows the cross-sectional view of one embodiment of a first device.

FIG. 1 shows a cross-sectional view of an embodiment of a first device 100. A substrate 105 is provided. The substrate, for example, is a semiconductor substrate, such as a silicon substrate. The substrate may also be other types of substrates, such as silicon-germanium (SiGe), germanium (Ge), gallium-arsenic (GaAs), silicon-on-insulator (SOI) or any other suitable semiconductor materials. In one embodiment, the substrate includes a p-type doped silicon substrate. The p-type doped substrate may be a lightly doped p-type substrate. Other types of semiconductor substrates, including those which are un-doped or doped with the same or other types of other dopants may also be useful.

A device region 110 is defined on the substrate. The device, for example, may be a CMOS device, MEMS, or other types of semiconductor devices. In one embodiment, the device region 110 is a MEMS device. The MEMS device, for example, may be a RF MEMS, Inertial MEMS or BioMEMS. Other types of MEMS devices may also be used.

A blocking layer 120 is defined on the substrate. The blocking layer is a dielectric material to prevent the porosification of the active surface underneath. In one embodiment, the dielectric material may be oxide, nitride, oxynitride or a combination thereof. Other types of dielectric materials may also be useful. The blocking layer may also be a plurality of dielectric layers to form, for example, a dielectric stack or sandwich. Other configurations of the dielectric layer may also be useful. The blocking layer defines one or more first bonding regions. Illustratively, two first bonding regions are provided on the substrate. Providing other number of bonding regions may also be useful. For example, a bonding region may be provided which is disposed around a periphery of the substrate or device. The bonding region corresponds to an area exposed by the blocking layer. The shape and dimensions of the first bonding region depend on area of contact of the opposite surface to be bonded, taking into account of process conditions such as misalignment. For example, the opening may take the shape of a square with side dimensions of about 50×50 µm. Providing other shapes or dimensions may also be useful. The blocking layer should be sufficiently thick to prevent porosification of the substrate below. For example, the blocking layer may be about 0.1 µm to 2 µm thick. Other thicknesses of the blocking layer may also be useful, for example, depending on process requirements.

A porosified layer 130 is formed in the first bonding regions. The porosified layer is formed, in one embodiment, by porosifying the exposed substrate regions. The porosified layer, for example, may be formed by stain etching or anodization of the exposed regions of the substrate. Other processes for forming the porosified layer may also be useful.

In one embodiment, the porosification process introduces nanoporous holes into the surface, creating microstructures of, for example silicon, in the active area. The porous nature softens the material, making deformation of the material easier. The porosified layer increases the effective contact area of the contact region with the opposite bonding surface under an application of bonding force. For the same bonding force, a bonded system involving a porous material would have a larger effective contact area and hence stronger bonding strength as compared to a non-porous material. At elevated temperatures, reflow might also occur more readily within the porous material, further increasing the bond quality. In one embodiment, the silicon active area is subjected to porosification. The porosified layer may be about 1 nm to 5 µm thick. Other thicknesses of the porosified layer may also be useful.

Figure 2:
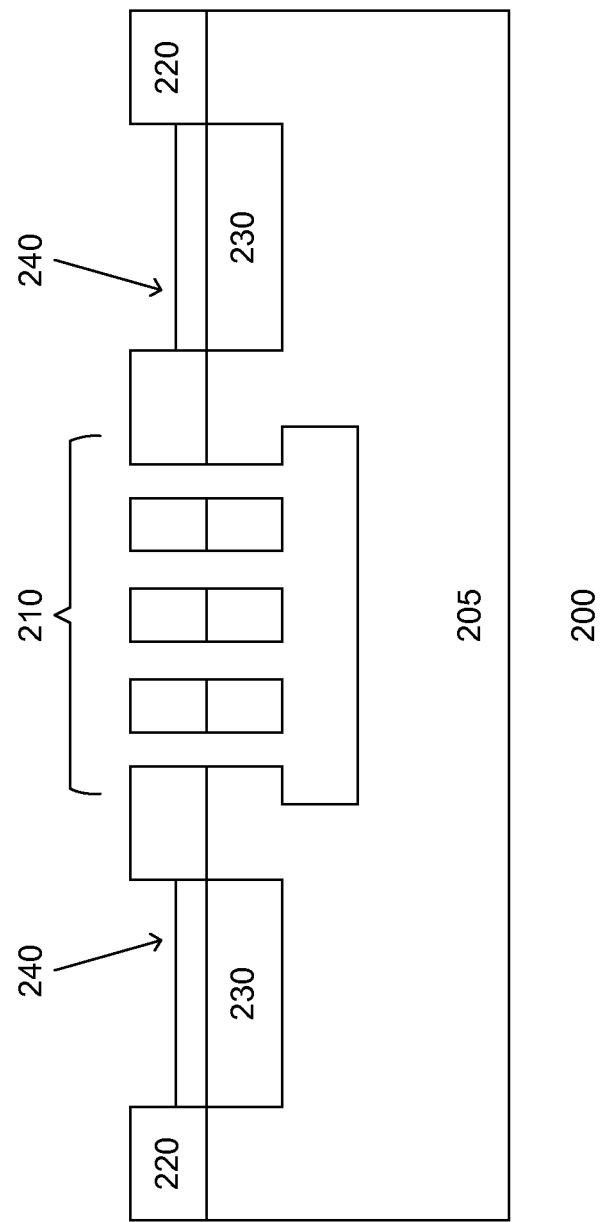
FIG. 2 shows the cross-sectional view of another embodiment of the first device.

FIG. 2 shows a cross-sectional view of another embodiment of a first device 200, similar to that described for device 100. In one embodiment, a protection layer 240 is disposed on the surface of porosified layer 230. The protection layer, for example, protects the underlying porosified layer during subsequent processing. The protection layer, for example, may be Titanium (Ti), Copper (Cu) or Aluminum (Al). The first bonding region of device 200, in one embodiment, is the surface of the metal layer 240. The thickness of the protection layer 240 may range from 1 nm to 1 µm. Other thicknesses of the protection layer may also be useful.

Figure 3:
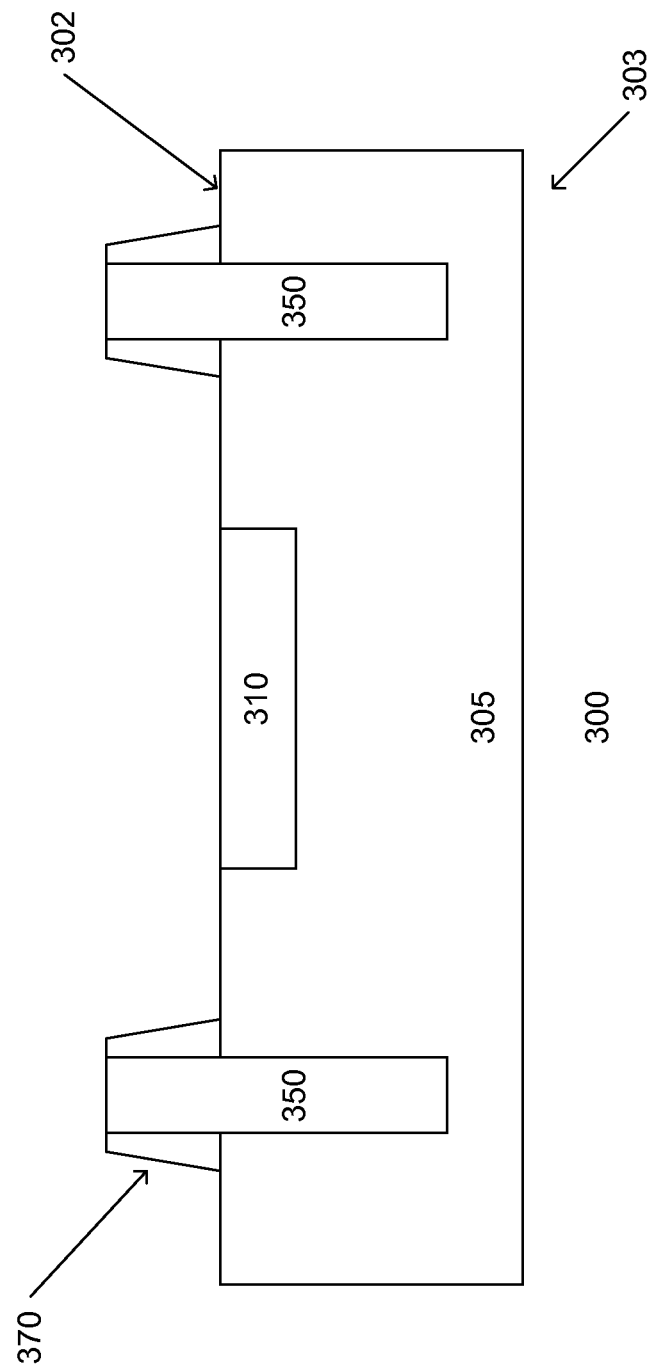
FIG. 3 shows the cross-sectional view of one embodiment of a second device.

FIG. 3 shows a cross-sectional view of an embodiment of a second device 300. A substrate 305 with top and bottom surfaces 302 and 303, respectively, is provided. The substrate, for example, is a semiconductor substrate, such as a silicon substrate. The substrate may also be other types of substrates, such as SiGe, Ge, GaAs, SOI or any other suitable semiconductor materials. In one embodiment, the substrate includes a p-type doped silicon substrate. The p-type doped substrate may be a lightly doped p-type substrate. Other types of semiconductor substrates, including those which are un-doped or doped with the same or other types of other dopants may also be useful. For example, the substrate may be a lightly doped p-type ($p^-$) or un-doped silicon layer on a heavily doped p-type ($p^+$) bulk or an un-doped or $p^-$ silicon on insulator.

A device layer 310 is defined on the substrate on the side of the top surface 302. The device, for example, may be a CMOS device, MEMS, or other types of semiconductor devices. In one embodiment, the device layer 310 is a CMOS device. The CMOS device, for example, may be a CMOS logic or CMOS sensor device. Other types of semiconductor devices may also be used.

Interconnects 350 are disposed in the substrate to provide mechanical and electrical connections. For example, the interconnects provide electrical connections between the top and bottom surfaces of the substrate, as well as to device layer 310. The second bonding regions for the second device 300, in one embodiment, are provided by the surface of interconnects 350. The interconnects can be dummies that are isolated from active devices and are solely for bonding purposes to provide the desired mechanical strength. In one embodiment, the interconnect is a Through Silicon Via (TSV) with a conductive material. The conductive material, for example, may include of copper, copper alloys or polysilicon. Other types of conductive materials may also be useful.

The interconnects may have a circular cross sectional shape. The diameter of the cross-section may be, for example, about 1 µm to 100 µm. Providing an interconnect having other cross-sectional shapes or sizes may also be useful. The depth of the interconnect may be, for example, about 10 µm to 500 µm. Providing other depths of the interconnect may also be helpful.

Interconnect dielectric layer 370 is disposed on the substrate. In one embodiment, the interconnect dielectric layer surrounds the interconnects 350 and is discontinuous on the substrate surface. The interconnect dielectric layer, for example, may be silicon oxide. Other types of dielectric material may also be used to serve as the interconnect dielectric layer.

The interconnect dielectric layer enables an empty space between the opposite bonding surfaces. This is to ensure optimal contact conditions between the-to-be-bonded surfaces and, if at least one of the surfaces contains a MEMS device, to accommodate any MEMS movement. The thickness of the interconnect dielectric layer may range from 0.5 µm to 10 µm. Other thicknesses of the interconnect dielectric layer may also be useful.

Figure 4:
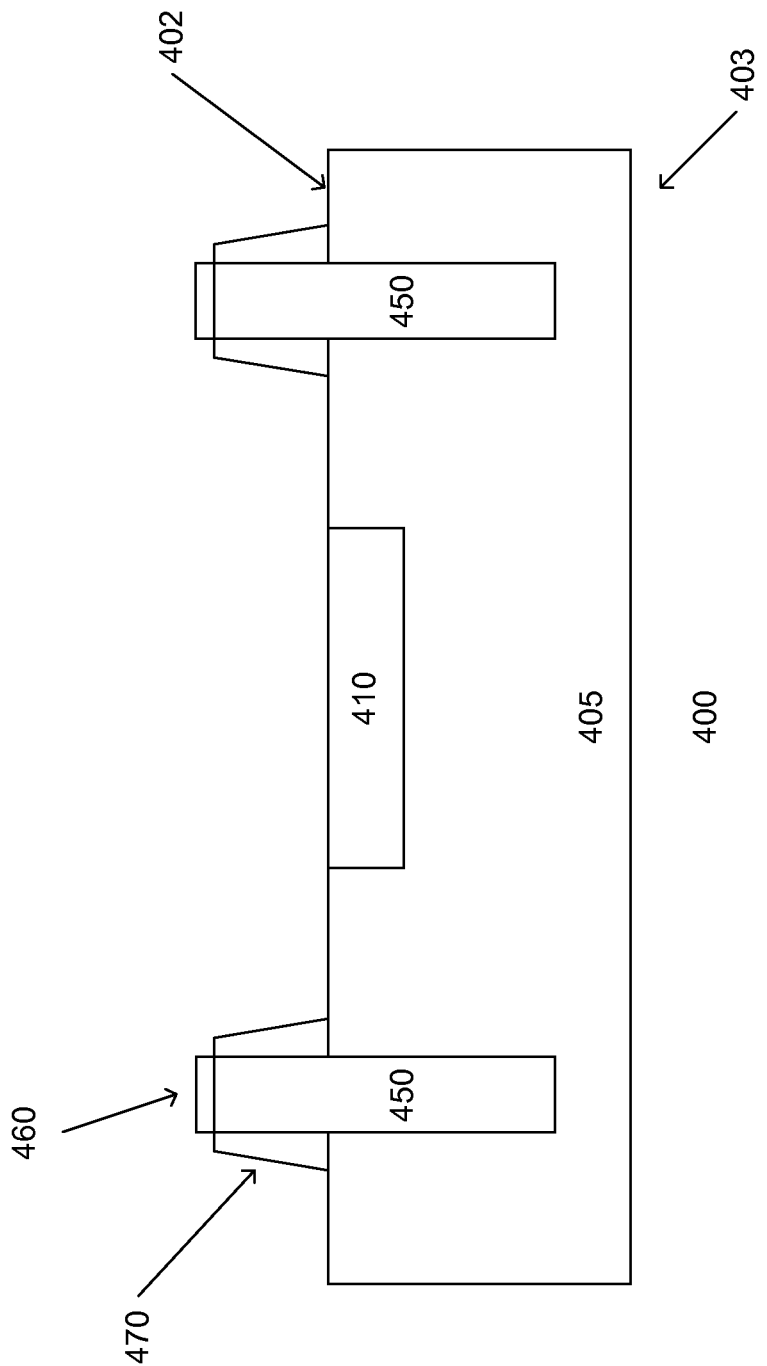
FIG. 4 shows the cross-sectional view of another embodiment of the second device.

FIG. 4 shows a cross-sectional view of another embodiment of the second device 400, similar to that described for device 300. In one embodiment, a metal layer 460 is disposed on the surface of the interconnect. Metal layer 460, for example, may include sintered metal or metal nanowires. The sintered metal may be Ti, Cu or Al. The metal nanowires may be Cu nanowires. Other types of sintered metal or metal nanowires may also be useful. The second bonding regions for the device 400 are provided by the surface of the metal layer 460. The thickness of the metallic layer may range from 0.1 µm to 5 µm. Other types or thicknesses of the metal layer may also be useful.

Figure 5:
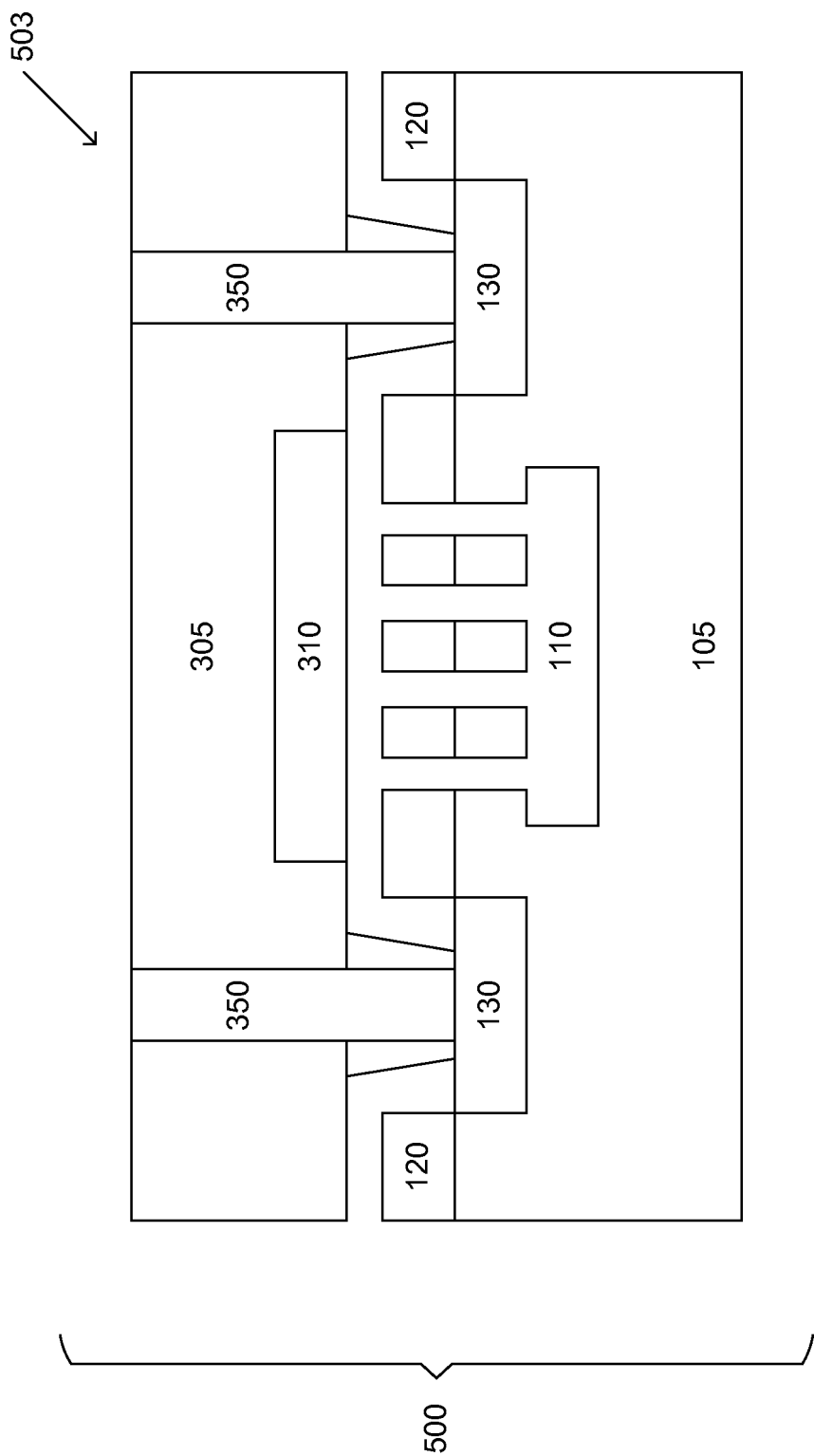
FIG. 5 shows the cross-sectional view of one embodiment of a bonded device having a first device and second device.

FIG. 5 shows a cross sectional view of an embodiment of a device 500, including the bonding of the first device 100 and second device 300. In one embodiment, the first device 100 and second device 300 are aligned to one another and bonded through the contacting surfaces of the first and second bonding regions of device 100 and device 300, respectively. The wafer on the side of surface 503 of device 500 is subsequently thinned down to expose the other end of the interconnect 350. The remaining thickness of the substrate 305 may be about 10 µm to 500 µm. Other thicknesses of the remaining substrate 305 may also be useful.

Figure 6:
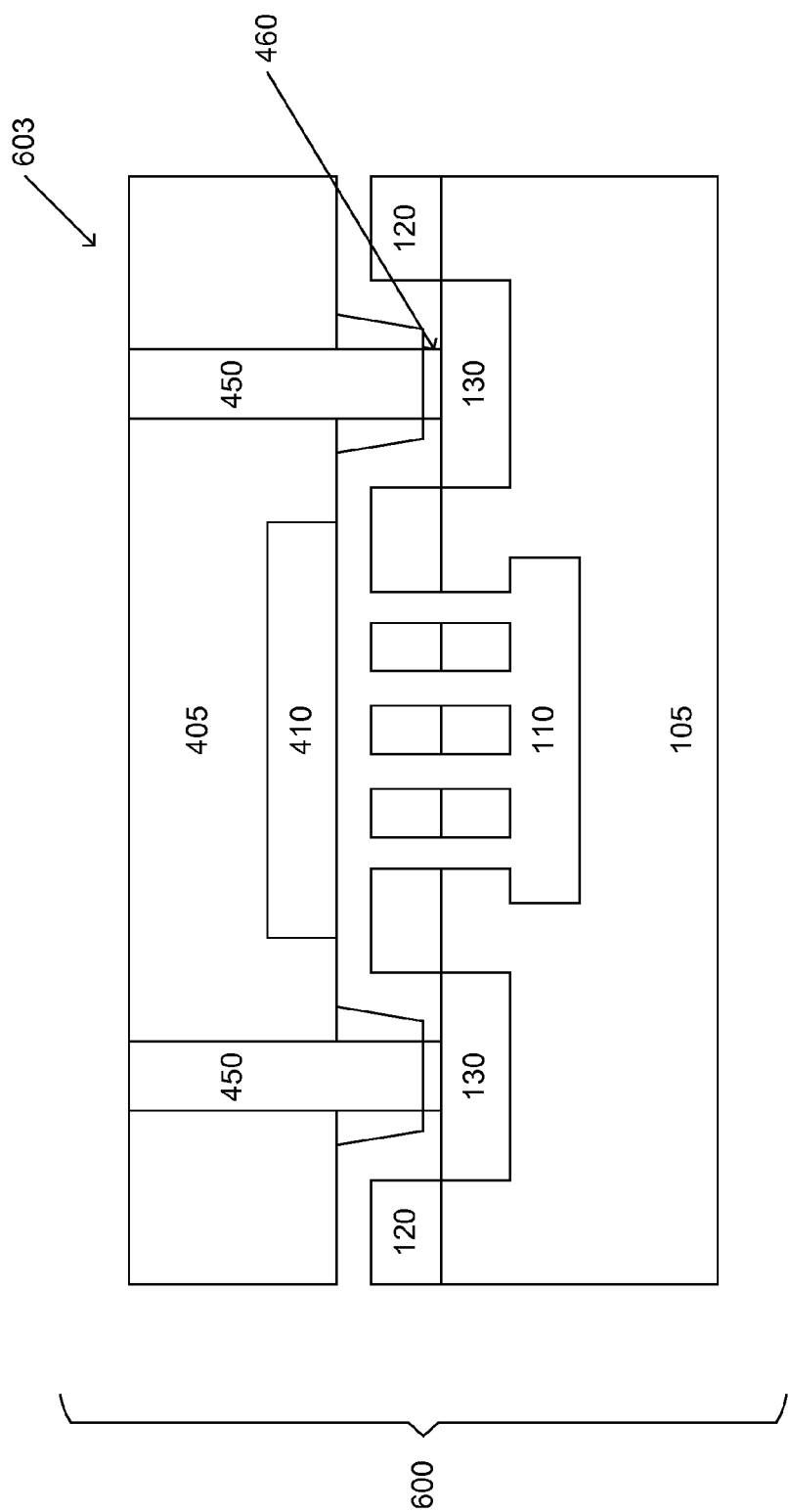
FIG. 6 shows the cross-sectional view of a second embodiment of a bonded device having a first device and second device.

FIG. 6 shows a cross sectional view of another embodiment of a device 600, including the bonding of the first device 100 and second device 400. In one embodiment, the first device 100 and second device 400 are aligned to one another and bonded through the contacting surfaces of the first and second bonding regions of device 100 and device 400, respectively. The wafer on the side of surface 603 of device 600 is subsequently thinned down to expose the other end of the interconnect 450. The remaining thickness of the substrate 405 may be about 10 µm to 500 µm. Other thicknesses of the remaining substrate 405 may also be useful.

Figure 7:
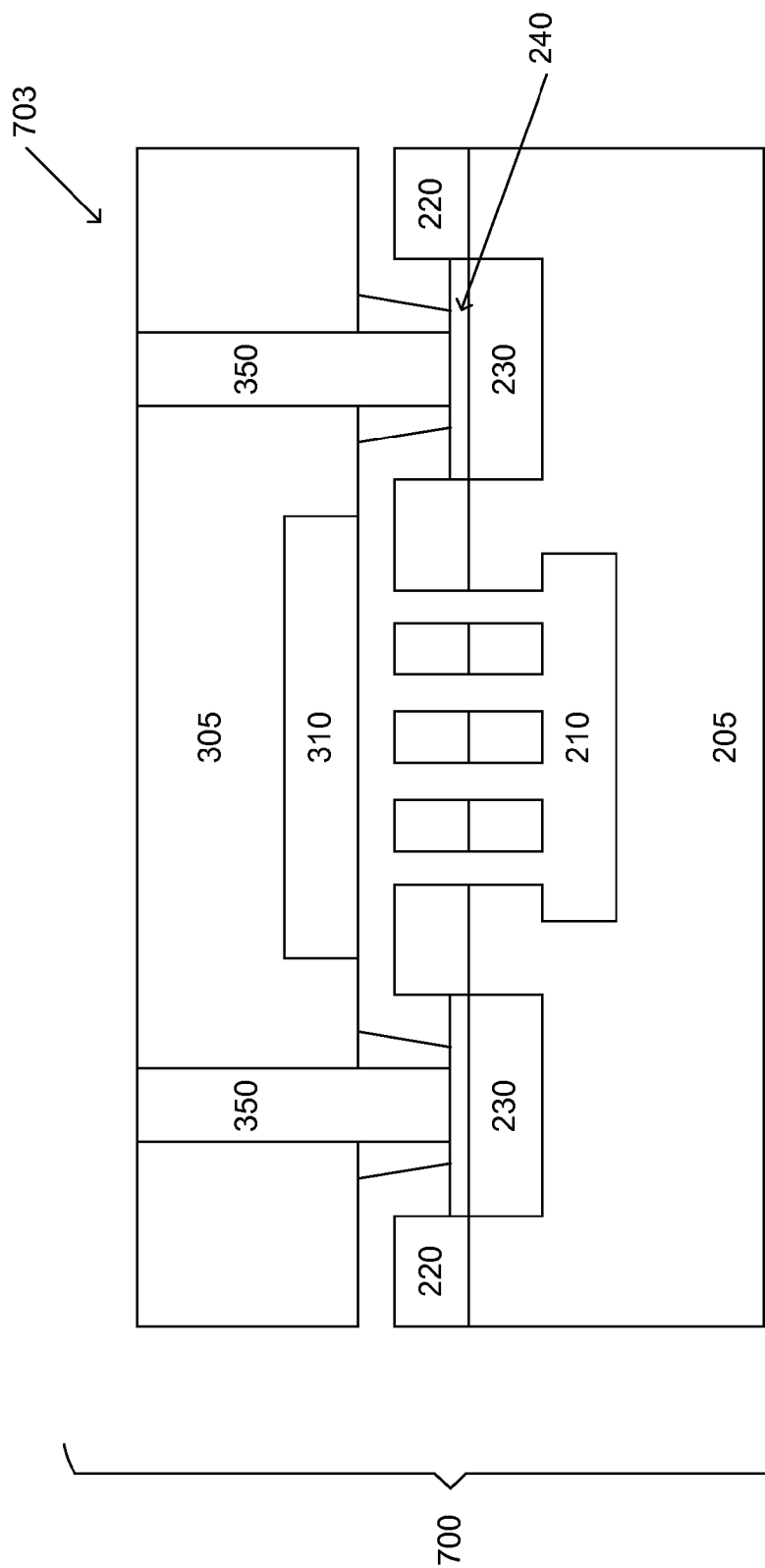
FIG. 7 shows the cross-sectional view of a third embodiment of a bonded device having a first device and second device.

FIG. 7 shows a cross sectional view of an embodiment of a device 700, including the bonding of the first device 200 and second device 300. In one embodiment, the first device 200 and second device 300 are aligned to one another and bonded through the contacting surfaces of the first and second bonding regions of device 200 and device 300, respectively. The wafer on the side of surface 703 of device 700 is subsequently thinned down to expose the other end of the interconnect 350. The remaining the thickness of substrate 305 may be about 10 µm to 500 µm. Other thicknesses of the remaining substrate 305 may also be useful.

Figure 8:
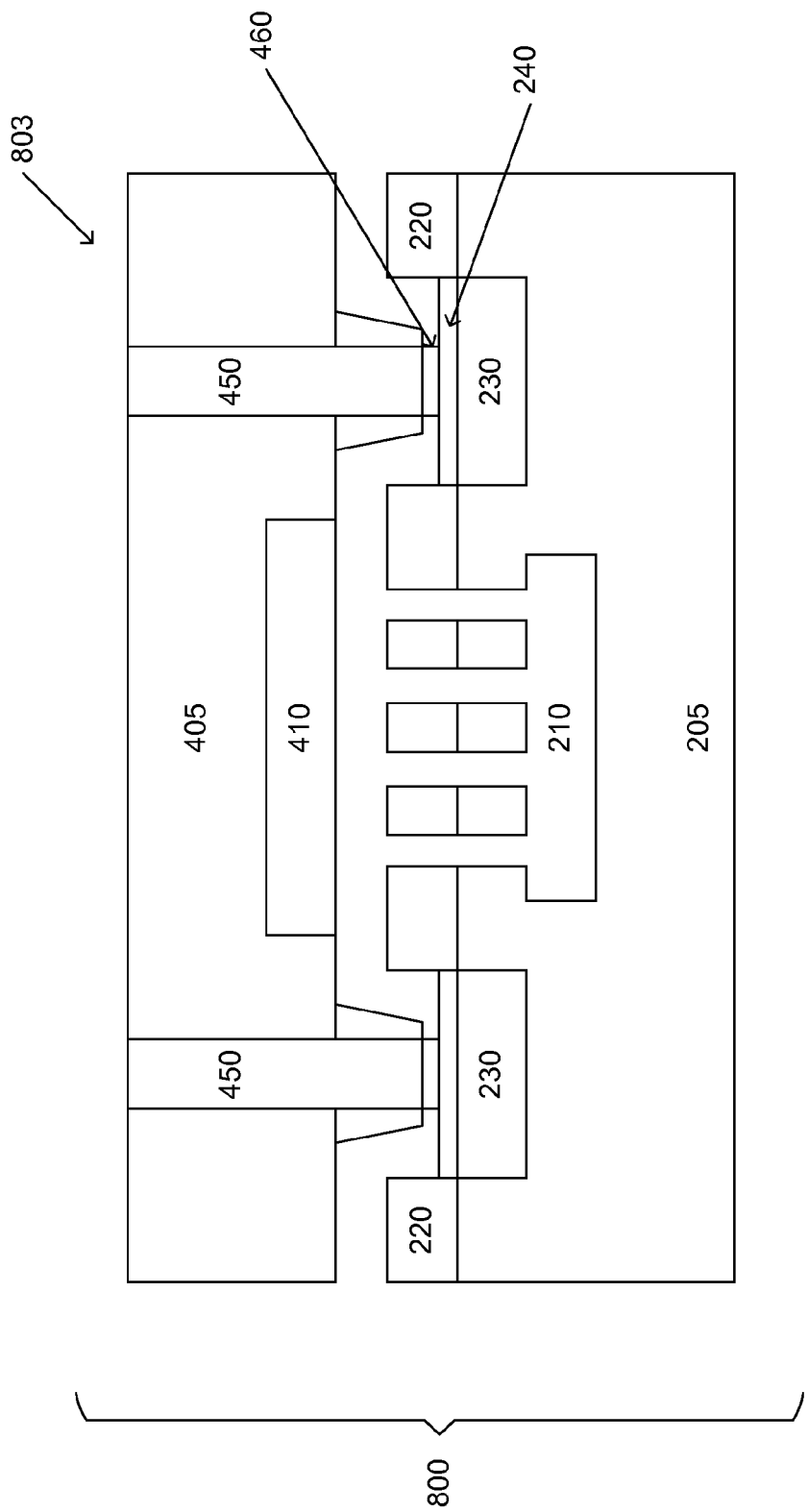
FIG. 8 shows the cross-sectional view of a fourth embodiment of a bonded device having a first device and second device.

FIG. 8 shows a cross sectional view of another embodiment of a device 800, including the bonding of the first device 200 and second device 400. In one embodiment, the first device 200 and second device 400 are aligned to one another and bonded through the contacting surfaces of the first and second bonding regions of device 200 and device 400, respectively. The wafer on the side of surface 803 of device 800 is subsequently thinned down to expose the other end of the interconnect 450. The remaining thickness of the substrate 405 may be about 10 µm to 500 µm. Other thicknesses of the remaining substrate 405 may also be useful.

Figure 9D:
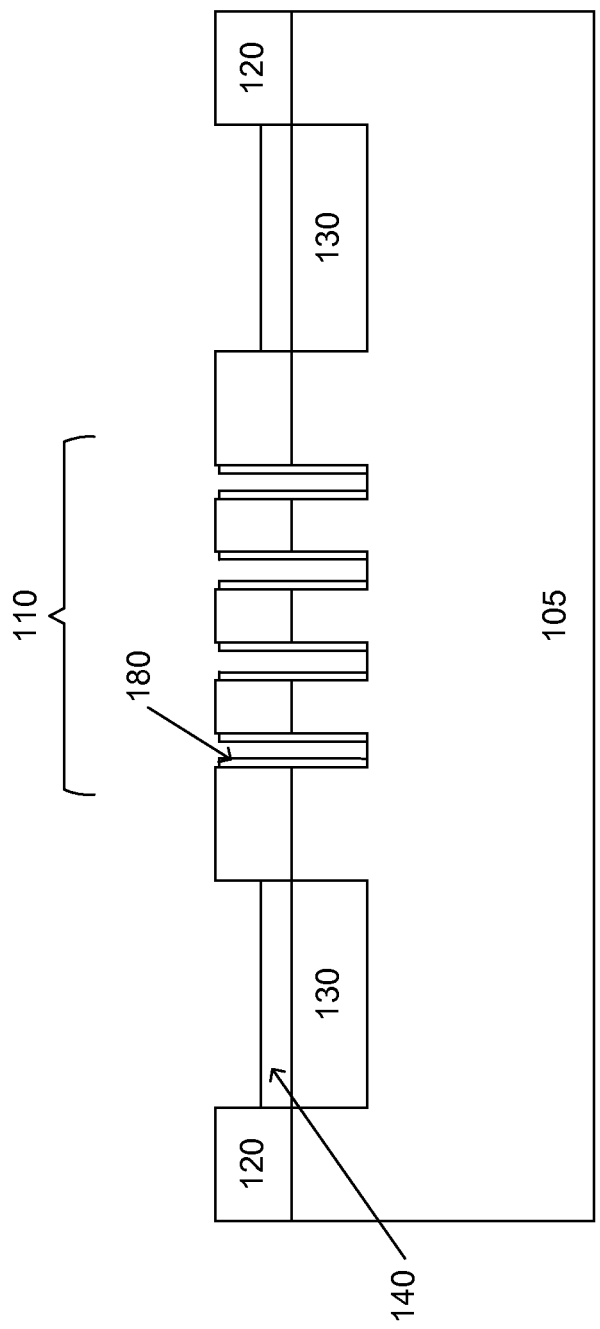

FIGS. 9a-e show cross-sectional views of an embodiment of a process for forming device 100. Referring to FIG. 9a, a substrate 105 is provided. The substrate can be a silicon substrate, such as a lightly doped p-type doped substrate. Other types of substrates, including silicon germanium or SOI are also useful.

As shown in FIG. 9a, blocking layer 120 is formed on the substrate. The blocking layer which includes a dielectric material is deposited on the substrate. The blocking layer, for example, may be silicon oxide. Other types of dielectric material, such as silicon nitride, may also be used. In one embodiment, the blocking layer may include silicon oxide or nitride. Other configurations such as multiple dielectric layers to form a dielectric stack or sandwich may also be useful. The blocking layer may be formed by chemical vapor deposition (CVD) or other techniques. The thickness of the blocking layer may be, for example, 1 nm to 5 µm. Other thickness for the blocking layer may also be useful.

The blocking layer can be patterned using lithography and etch techniques. For example, a photoresist layer is formed over the blocking layer and patterned using a lithographic mask, exposing portions of the blocking layer to be removed. An anisotropic etch, such as reactive-ion-etch (RIE), is performed to remove exposed portions of the blocking layer. To improve lithographic resolution, an anti-reflective coating (ARC) can be provided beneath the photoresist. Other techniques for patterning the dielectric layer may also be useful.

In FIG. 9b, a porosified layer 130 is formed in the substrate. The porosified layer, for example, is porous silicon. Other types of semiconductor materials may also be useful. The thickness of the porosified layer may be about 1 nm to 5 µm. Other porosified layer thickness may also be useful. The porosified layer may be formed by, for example, stain etching or anodization. In one embodiment, porous silicon is formed by stain etching. A porous silicon layer can be, for example, formed by reaction in a mixture of nitric acid, hydrofluoric acid and water. The temperature of the etching can be, for example, about 10° C. to 200° C. Other forms of stain etching may also be useful.

In another embodiment, porous silicon is formed through the use of a anodization cell. A possible anodization cell employs platinum cathode and the silicon surface as the anode, immersed in a hydrogen fluoride electrolyte. Corrosion of the anode is produced by running electrical current through the cell. Other forms of anodization may also be useful The porous silicon is subsequently cleaned with dilute hydrofluoric (DHF) acid and is immediately followed by forming a protection layer 140 over the porosified surface to prevent oxidation of the porous silicon. The protection layer, for example, may be a dielectric or a metallic layer. In one embodiment, the protection layer is a dielectric layer which includes silicon oxide, oxynitride or nitride. The thickness of the dielectric layer may be about 1 nm to 5 µm. Other types of dielectric materials or thicknesses may also be useful. The dielectric material may be other types of gate dielectric materials and/or be formed by other types of processes, such as CVD.

In FIG. 9c, a device 110 is formed on the substrate. In one embodiment, device 110 is a MEMS device. Trenches 175 are first formed on the substrate. Patterning the trenches can be achieved using lithography and etch techniques. For example, a photoresist layer is formed over the blocking layer and patterned using a lithographic mask, exposing portions of the blocking layer to be removed. An anisotropic etch, such as RIE, is performed to remove exposed portions of the blocking layer. To improve lithographic resolution, an ARC can be provided beneath the photoresist. Other techniques for patterning the dielectric layer may also be useful.

As shown in FIG. 9d, a dielectric layer is formed over the surface followed by an anisotropic etch such as RIE, exposing the bottom of the trench and forming dielectric sidewalls 180. The dielectric layer, for example, may be silicon oxide. Other types of dielectric material, such as silicon nitride, may also be used. In one embodiment, the dielectric layer may be silicon oxide or nitride. The dielectric layer may be formed by CVD or other techniques. The thickness of the dielectric layer may be, for example, about 0.1 µm to 2 µm. Other thickness for the dielectric layer may also be useful.

Figure 9E:
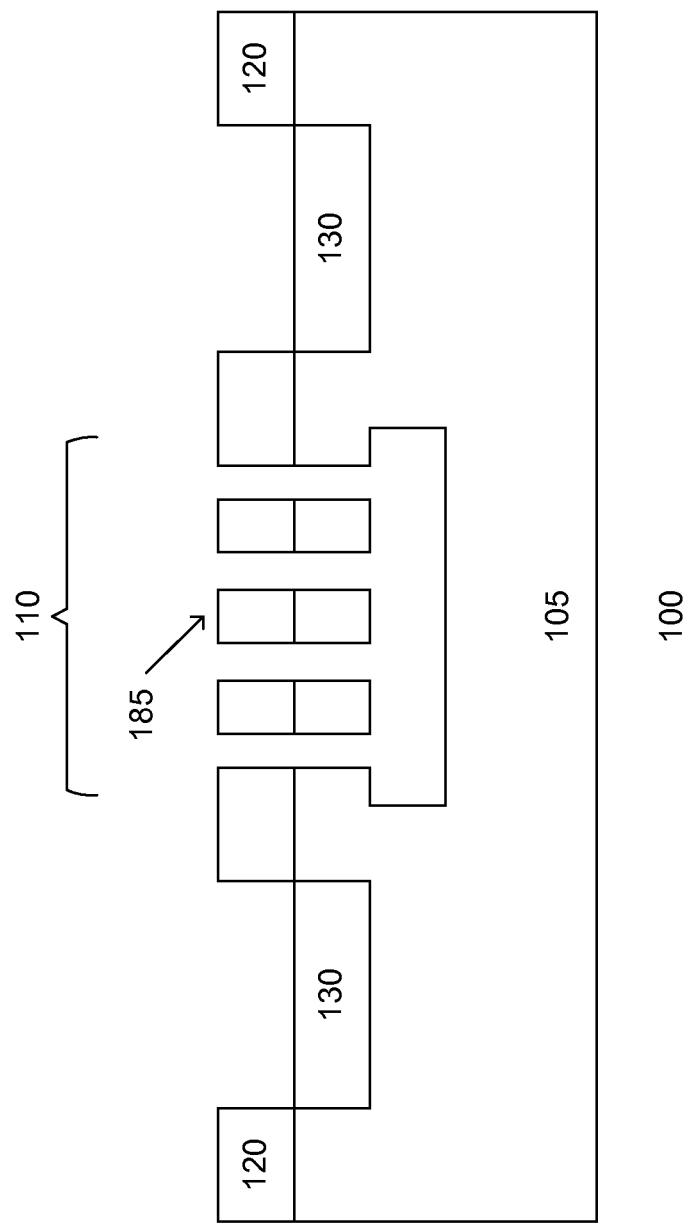

In FIG. 9e, moving parts 185 are formed on the substrate. In one embodiment, the moving parts 185 are formed by an isotropic wet etch which includes hydrofluoric acid, removing the substrate material beneath the moving parts. Other methods of creating the moving parts may also be useful. Protection layers 140 and dielectric sidewalls 180 are also removed. Protection layers 140 are removed to facilitate subsequent bonding with the opposite surface. Protection layers 140 and dielectric sidewalls 180 could be removed at the same time as the formation of moving parts 185, or could be a separate process, for example, RIE or wet etch. Other methods of removal may also be useful.

The fabrication process for device 200 is similar to that for device 100 except that the protection layers 240 are metal layers which include Ti, Cu or Al and they are not removed during the formation of the moving parts. The thickness of the metallic layer may be about 0.1 µm to 5 µm. Other types of metallic materials or thicknesses may also be useful. The metallic material may include other types of metallic materials and/or be formed by other types of processes, such as physical vapor deposition (PVD). The protection layer may be used to bond with the opposite surface and hence not to be removed.

Figure 10A:
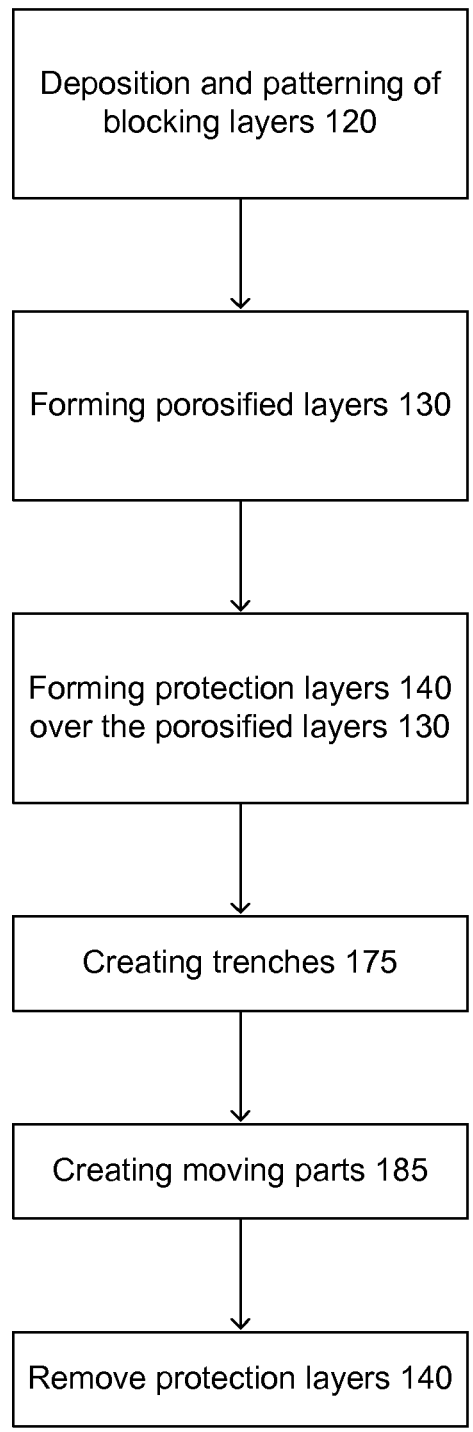
FIGS. 10a-c show the flow charts with different methods of fabricating a porosification layer on a first device in accordance with one embodiment of the invention.

FIG. 10a illustrates a fabrication process flow chart for one embodiment of device 100. The recited process steps in the flow chart were discussed earlier in which porosified layers 130 are created before trenches 175. Such a fabrication sequence is defined as the porous-surface-first approach.

Figure 10B:
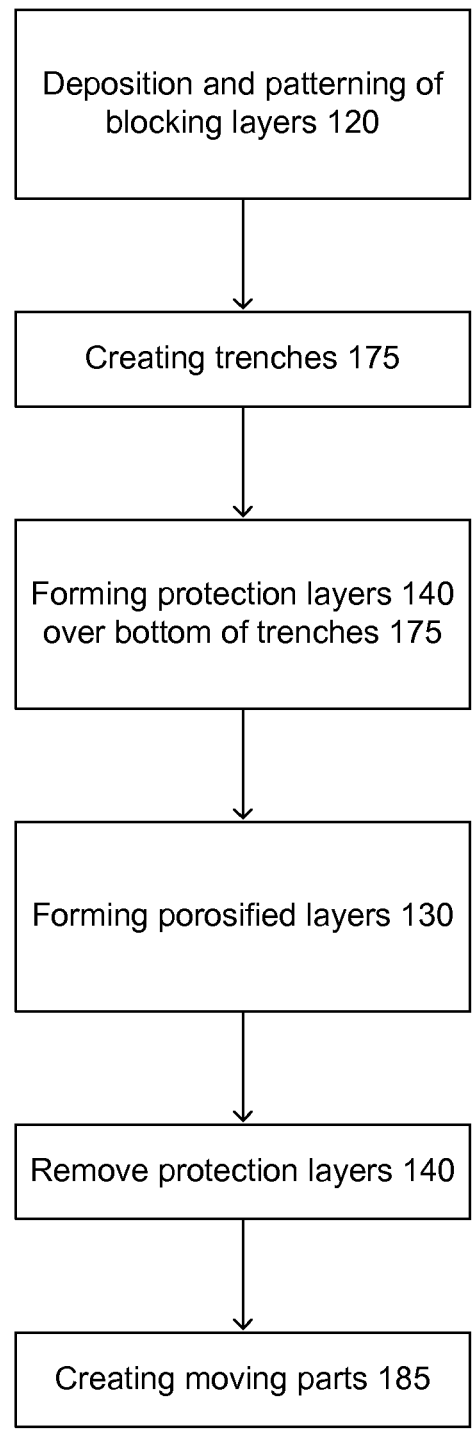

FIG. 10b illustrates a fabrication process flow chart for another embodiment of device 100. The fabrication sequence is similar to that of the porous-surface-first approach except that the porosified layers 130 are created after the formation of trenches 175 but before the creation of the moving parts 185. Such an embodiment is defined as porous-surface-middle approach.

Figure 10C:
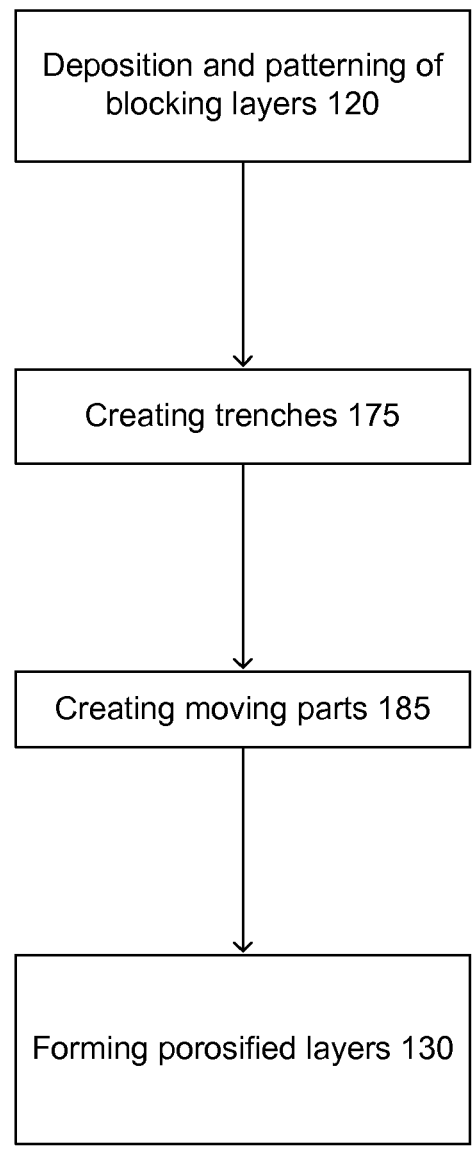

FIG. 10c illustrates a fabrication process flow chart for yet another embodiment of device 100. In this fabrication sequence, porosified layers 130 are formed after the formation of both trenches 175 and moving parts 185. Such an embodiment is defined as porous-surface-last approach.

The preferred fabrication sequence would be the porous-surface-first approach because in the other two mentioned fabrication sequences, moving parts 185 could be exposed to the porosified process, thereby altering the surface characteristics and could have adverse impact in the performance of the MEMS device.

FIGS. 11 a-c show cross-sectional views of an embodiment of a process for forming a device 300. Referring to FIG. 11a, a substrate 305 is provided. The substrate can be a silicon substrate, such as a lightly doped p-type doped substrate. Other types of substrates, including SiGe, GaAs or SOI are also useful.

A device layer 310 is disposed in the substrate. In one embodiment, the device 310 is a CMOS device created by conventional semiconductor fabrication processes. Other types of semiconductor devices may also be applicable. A dielectric layer 365 is disposed on the substrate. To form the dielectric layer, a dielectric material is deposited on the substrate. The interconnect dielectric layer, for example, may be silicon oxide. Other types of dielectric material, such as silicon nitride, may also be used. In one embodiment, the dielectric layer may include silicon oxide. The dielectric layer may be formed by CVD or other techniques. The thickness of the dielectric layer may be, for example, 0.5 µm to 10 µm. Other thickness for the dielectric layer may also be useful.

As shown in FIG. 11b, interconnects 350 are disposed in the substrate. The interconnects, in one embodiment, are TSVs. A conductive material is deposited into the TSVs. The conductive material, for example, may include Cu, Cu alloys or polysilicon. Other types of conductive materials may also be useful. Any excess conductive material is removed, for example, by chemical-mechanical-polishing (CMP) processes to achieve a planar top surface. The depth of the TSV, for example, may be about 10 µm to 500 µm range. Providing a TSV having other depths may also be useful and, for example, may depend on the desired final thickness of the device.

Figure 11C:
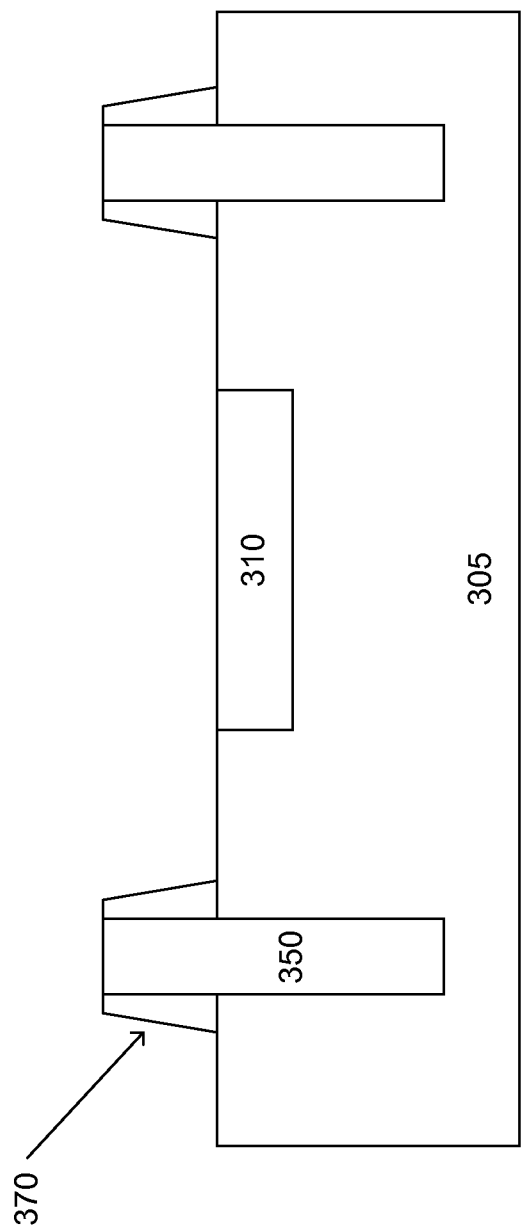

The dielectric layer 365 are patterned to form interconnect dielectric layers 370, as shown in FIG. 11c. Dielectric layer 365 can be patterned using lithography and etch techniques. For example, a photoresist layer is formed over the dielectric layer and patterned using a lithographic mask, exposing portions of the dielectric layer to be removed. An anisotropic etch, such as RIE, is performed to remove exposed portions of the dielectric layer. To improve lithographic resolution, an ARC can be provided beneath the photoresist. Other techniques for patterning the dielectric layer may also be useful.

The fabrication process for device 400 is similar to that for device 300, except that a metal layer 460 is disposed on the surface of the interconnect 450. The metal layer, for example, may be of sintered metal formed of Ti, Cu or Al. The metallic element is disposed on the surface of the wafer to be heated in a sintering furnace below its melting point (solid state sintering) until its particle adhere to each other. In one embodiment, the heating temperature, for example, may be about 100° C. to 300° C. Providing other ranges of heating temperatures may be useful. The thickness of the metal layer may be, for example, about 0.1 µm to 5 µm. Providing a metal layer having other thicknesses may also be useful.

In another embodiment, the metal layer may include metal nanowires. The metal nanowires, for example, may be of the Cu element. The metal nanowires may be formed by conventional nanowire fabrication processes which include CVD and electro-deposition. Other types of nanowire fabrication processes would be useful. Providing a metallic layer having other thicknesses may also be useful.

It was mentioned earlier that there are various embodiments in the bonding of the devices. In one embodiment, device 500 includes the bonding of devices 100 and 300. The surfaces of the first and second bonding regions of devices 100 and 300, respectively are aligned and brought into contact under elevated temperatures and an application of bonding force. In one embodiment, eutectic bonding is used in the bonding of the surfaces. The bonding temperature may be, for example, 100° C. to 650° C. and the bonding force may be, for example, 0.1 KN to 80 KN depending on the pattern density of the bonded surfaces. Other types of bonding methods and the associated bonding temperatures and/or bonding forces may be useful. Surface 503 of device 500 is subsequently thinned down by CMP processes to expose the TSV. Other methods to thin down the device, for example by wet-oxide removal in the case of SOI wafer, may also be useful.

In another embodiment, device 600 includes the bonding of devices 100 and 400. The surfaces of the first and second bonding regions of devices 100 and 400, respectively are aligned and brought into contact under elevated temperatures and an application of bonding force. In one embodiment, eutectic bonding is used in the bonding of the surfaces. The bonding temperature may be, for example, 100° C. to 650° C. and the bonding force may be, for example, 0.1 KN to 80 KN. Other types of bonding methods and the associated bonding temperatures and/or bonding forces may be useful. Surface 603 of device 600 is subsequently thinned down by CMP to expose the TSV. Other methods to thin down the device, for example by wet-oxide removal in the case of SOI wafer, may also be useful.

In another embodiment, device 700 includes the bonding of devices 200 and 300. The surfaces of the first and second bonding regions of devices 200 and 300, respectively are aligned and brought into contact under elevated temperatures and an application of bonding force. In one embodiment, thermo-compression bonding is used in the bonding of the surfaces. The bonding temperature may be, for example, 100° C. to 650° C. and the bonding force may be, for example, 0.1 KN to 80 KN. Other types of bonding methods and the associated bonding temperatures and/or bonding forces may be useful. Surface 703 of the device 700 is subsequently thinned down by CMP to expose the bottom the TSV. Other methods to thin down the device, for example by wet-oxide removal in the case of SOI wafer, may also be useful.

In yet another embodiment, device 800 includes the bonding of devices 200 and 400. The surfaces of the first and second bonding regions of devices 200 and 400, respectively are aligned and brought into contact under elevated temperatures and an application of bonding force. In one embodiment, thermo-compression bonding is used in the bonding of the surfaces. The bonding temperature may be, for example, 100° C. to 650° C. and the bonding force may be, for example, 0.1 KN to 80 KN. Other types of bonding methods and the associated bonding temperatures and/or bonding forces may be useful. Surface 803 of the device 800 is subsequently thinned down by CMP to expose TSV. Other methods to thin down the device, for example by wet-oxide removal in the case of SOI wafer, may also be useful.

The bonded device may be hermetically sealed and depending on the type of application, may require an operating environment of either a high or low vacuum or with high pressure. In one exemplary application, the bonded device includes a gyroscope MEMS device which requires a high vacuum operating environment. In another exemplary application, the bonded device includes an accelerometer MEMS device which, depending on its specifications, requires either a high or low vacuum or with high pressure operating environment.

In one embodiment, the bonded device requires a low vacuum operating environment. Prior to bonding, a self-assembled monolayer (SAM) (not shown) is deposited over the surface. When the bonded device is annealed at an elevated temperature ranging from 100° C. to 1000° C., the SAM would decompose, releasing gas molecules into the evacuated space and increasing the pressure in the encapsulated regions or lower level of vacuum. The SAM is a layer of amphiphilic molecules one end of which exhibit a certain affinity for the substrate. In one embodiment, the SAM includes a hydrocarbon based chemical compound and is deposited from the vapor phase. Other types of chemical compounds and deposition may also be useful.

In another embodiment, the bonded device requires an ultra-high vacuum operating environment. Prior to bonding, a getter material (not shown), for example Al, Zr, Ti, Hf and their alloys, is disposed on the surface. For instance, the protection (metal) layer 240 in device 200 may further include such gettering materials. Other types of getter material may also be useful. When the bonded device is annealed at an elevated temperature ranging from 100° C. to 1000° C., the getter material in contact with residual gas molecules would combine chemically or by absorption, removing the residual gas molecules from the evacuated space and providing a higher level of vacuum.

Forming the different embodiments involves changing the pattern on the lithographic masks. Additional process steps would also be required. Furthermore, it is understood that the process as described is not limited to the specific sequence of steps disclosed. For example, some steps may be performed in different sequences and/or additional steps may be added.

The invention may be embodied in other forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for bonding semiconductor surfaces comprising:
providing a first substrate with a first bonding region, wherein the first bonding region comprises a first bonding surface with a porosified region which is formed in the first substrate and is part of first substrate material;
providing a second substrate with a second bonding region having a second bonding surface, wherein the second bonding surface includes a second conductive contact comprising a TSV contact;
aligning the second conductive contact of the second bonding surface to be above and within the porosified region of the first bonding surface; and
bonding the second bonding surface with the second conductive contact to the first bonding surface with the porosified region by applying pressure at an elevated temperature.

2. The method of claim 1 wherein the porosified region comprises silicon, germanium or silicon germanium.

3. The method of claim 2 comprises forming the porosified region in the first bonding region, wherein forming the porosified region comprises stain etching or anodization.

4. The method of claim 1 comprises forming the porosified region in the first bonding region, wherein forming the porosified region comprises stain etching or anodization.

5. The method of claim 4 further comprises forming a first metal layer over the porosified region of the first bonding surface, wherein the porosified region causes the complete first metal layer to remain in direct contact with the porosified region after bonding.

6. The method of claim 5 further comprises forming a second metal layer over the second conductive contact, wherein the second metal layer bonds to the first metal layer in the first bonding region.

7. The method of claim 6 wherein the first and second metal layers comprise Titanium (Ti), Copper (Cu), Aluminum (Al) or a combination thereof.

8. The method of claim 6 wherein the first and second metal layers comprise sintered metal or metal nanowires or a combination thereof.

9. The method of claim 4 further comprises forming a second metal layer over the second conductive contact, wherein the second metal layer bonds to the porosified region of the first bonding surface.

10. The method of claim 9 wherein the second metal layer comprises Ti, Cu, Al or a combination thereof.

11. The method of claim 9 wherein bonding comprises eutectic bonding or thermo-compression bonding.

12. The method of claim 1 further comprises forming a first metal layer over the porosified region of the first bonding surface, wherein the porosified region causes the complete first metal layer to remain in direct contact with the porosified region after bonding.

13. The method of claim 12 further comprises forming a second metal layer over the second conductive contact, wherein the second metal layer bonds to the first metal layer in the first bonding region.

14. The method of claim 1 further comprises forming a getter layer over the second bonding surface.

15. The method of claim 1 further comprises forming a SAM layer over the first bonding region.

16. The method of claim 1 wherein bonding comprises eutectic bonding or thermo-compression bonding.

17. The method of claim 1 wherein:
the first substrate comprises a MEMS device; and
the second substrate comprises a CMOS device.

18. The method of claim 1 comprising providing an interconnect dielectric layer on the second substrate, wherein the interconnect dielectric layer surrounds the TSV contact and is discontinuous on surface of the second substrate.

19. A method for bonding semiconductor surfaces comprising:
providing a first substrate with a first bonding region with a first bonding surface, wherein the first bonding surface comprises a porosified surface which is formed in the first substrate and is part of first substrate material;
providing a second substrate with a second bonding region having a second conductive contact, wherein the second conductive contact comprises a TSV contact;
aligning the first bonding region with the second bonding region; and
bonding the second conductive contact directly to the porosified surface of the first bonding region by applying pressure at an elevated temperature.

20. The method of claim 19 comprises forming the porosified surface in the first bonding region, wherein forming the porosified surface comprises stain etching or anodization.

21. The method of claim 19 wherein bonding comprises eutectic bonding or thermo-compression bonding.

22. The method of claim 21 wherein:
the first substrate comprises a MEMS device; and
the second substrate comprises a CMOS device.

23. The method of claim 19 wherein the porosified surface comprises silicon, germanium or silicon germanium.

24. A method of fabricating a MEMS structure comprising:
providing a first substrate comprising a MEMs device with a first bonding region with a first bonding surface, wherein the first bonding surface comprises a porosified surface;
providing a second substrate comprising a CMOS device with a second bonding region having a second conductive contact, wherein the second conductive contact comprises a TSV contact;
aligning the first bonding region with the second bonding region; and
bonding the second conductive contact directly to the porosified surface of the first bonding region by applying pressure at an elevated temperature.

25. The method of claim 24 wherein the porosified surface comprises silicon, germanium or silicon germanium.

26. The method of claim 25 wherein bonding comprises eutectic bonding or thermo-compression bonding.

* * * * *